(12) United States Patent
Menu et al.

(10) Patent No.: US 8,379,740 B2
(45) Date of Patent: Feb. 19, 2013

(54) WIDE-BAND SIGNAL PROCESSOR

(75) Inventors: Michel Menu, Grenoble (FR); Ivan Bourmeyster, Crolles (FR)

(73) Assignee: STMicroelectronics S.A., Montrouge (FR)

( * ) Notice: Subject to any disclaimer, the term of this patent is extended or adjusted under 35 U.S.C. 154(b) by 531 days.

(21) Appl. No.: 12/643,489

(22) Filed: Dec. 21, 2009

(65) Prior Publication Data
US 2010/0158158 A1 Jun. 24, 2010

(30) Foreign Application Priority Data
Dec. 23, 2008 (FR) ...................... 08 59019

(51) Int. Cl.
*H04K 1/10* (2006.01)
(52) U.S. Cl. ........................................ 375/260
(58) Field of Classification Search .................. 375/260, 375/295
See application file for complete search history.

(56) References Cited

U.S. PATENT DOCUMENTS

| | | | |
|---|---|---|---|
| 4,223,185 A * | 9/1980 | Picou ............................. | 708/404 |
| 4,972,436 A * | 11/1990 | Halim et al. ................... | 375/247 |
| 5,774,561 A | 6/1998 | Nakagawa et al. | |
| 6,028,890 A * | 2/2000 | Salami et al. .................. | 375/216 |
| 2005/0094744 A1* | 5/2005 | Ramachandran et al. ..... | 375/316 |
| 2009/0140900 A1* | 6/2009 | Pun et al. ....................... | 341/143 |

FOREIGN PATENT DOCUMENTS

WO WO 01/50458 A1 7/2001

OTHER PUBLICATIONS

French Search Report dated Sep. 15, 2009 from corresponding French Application No. 08/59019.
Liu, B, et al., *The design of Nonuniform-Band Maximally Decimated Filter Banks*; Proceedings of the International Symposium on Circuits and Systems (ISCS), Chicago, May 3-6, 1993; Proceedings of the International Symposium on Circuits and Systems (ISCS), Chicago, May 3-6, 1993, New York, IEEE, US., vol. 1-, May 3, 1993, pp. 375-378, XP010115181.

\* cited by examiner

*Primary Examiner* — Don N Vo
(74) *Attorney, Agent, or Firm* — Wolf, Greenfield & Sacks, P.C.

(57) ABSTRACT

A signal processor for processing a digital input signal including samples sampled at a sampling frequency, the signal processor comprising a plurality of filters arranged to divide the digital input signal into a first signal in a first frequency band below a first cut-off frequency, and a second signal in a second frequency band above a second cut-off frequency; first frequency shifting circuitry arranged to shift the second signal to a frequency band below the first cut-off frequency; decimation circuitry arranged to decimate the first signal and the shifted second signal; and processing circuitry arranged to process the decimated first and second signals.

27 Claims, 2 Drawing Sheets

WIDE-BAND SIGNAL PROCESSOR

CROSS REFERENCE TO RELATED APPLICATIONS

This application claims the priority benefit of French patent application No. 08/59019, filed on Dec. 23, 2008, entitled "WIDE-BAND SIGNAL PROCESSOR," which is hereby incorporated by reference to the maximum extent allowable by law.

BACKGROUND OF THE INVENTION

1. Field of the Invention

The present invention relates to a digital signal processor and method for processing an input signal, in particular a wide-band input signal.

2. Discussion of the Related Art

In digital signal processing systems, analog input signals are generally sampled at twice the Nyquist frequency, in other words at twice the bandwidth of the signal, to convert them into digital signals. Increasing the sampling frequency therefore also increases the bandwidth of the signal that can be recovered.

Wide-band signals have a larger bandwidth than normal signals, and are thus sampled at a higher frequency. However, this leads to an increase in the number of the samples generated for the input signal, and thus processing the signal becomes more complex. This in turn leads to higher power consumption, and more demand in terms of silicon area of the processing circuitry.

SUMMARY OF THE INVENTION

The present invention aims to at least partly address one or more problems in the prior art.

According to one aspect of the present invention, there is provided a signal processor for processing a digital input signal comprising samples sampled at a sampling frequency, the signal processor comprising a plurality of filters arranged to divide the digital input signal into a first signal in a first frequency band below a first cut-off frequency, and a second signal in a second frequency band above a second cut-off frequency; first frequency shifting circuitry arranged to shift the second signal to a frequency band below the first cut-off frequency; decimation circuitry arranged to decimate the first signal to generate a first decimated signal and the second frequency shifted signal to generate a second decimated signal, the first and second decimated signals having samples at most at half the sampling frequency of the digital input signal; and processing circuitry arranged to process the decimated first and second signals.

According to one embodiment of the present invention, the first frequency shifting circuitry comprises first modulating circuitry arranged to modulate the second signal by a modulating signal at a modulation frequency and a low-pass filter arranged to filter the modulated signal.

According to another embodiment of the present invention, the first cut-off frequency is equal to $f_s/4 - d_{f1}$, wherein $f_s$ is the sampling frequency, and $d_{f1}$ is a first frequency spacing, and the second cut-off frequency is equal to $f_s/4 - d_{f2}$, where $d_{f2}$ is a second frequency spacing, $d_{f1}$ and $d_{f2}$ for example each equal to between 20 Hz and 1 kHz.

According to another embodiment of the present invention, the digital input signal has a frequency band between 0 Hz and a high frequency limit $f_h$, the second frequency signal has a frequency band between the second cut-off frequency and a third cut-off frequency equal to $f_h/2 + d_{f3}$, wherein $d_{f3}$ is a third frequency spacing equal to between 20 Hz and 1 kHz.

According to another embodiment of the present invention, the signal processor further comprises insertion circuitry coupled to first and second outputs of the processing circuitry for receiving the first and second processed signals respectively, and arranged to insert samples into the processed first and second signals to generate modified first and second signals; second frequency shifting circuitry arranged to shift the second modified signal to a frequency band above the second cut-off frequency; and signal reconstruction circuitry arranged to combine said first modified signal and the frequency shifted second modified signal to generate an output signal having samples at said sampling frequency.

According to another embodiment of the present invention, the second frequency shifting circuitry comprises second modulation circuitry arranged to modulate the second signal by said modulating signal at the modulation frequency; and a high-pass filter arranged to filter the output of the second modulation circuitry.

According to another embodiment of the present invention, the first and second frequency shifting circuitry each further comprise an amplifier for amplifying the modulated signals.

According to another embodiment of the present invention, the high-pass filter has a cut-off frequency equal to the second cut-off frequency minus a fourth frequency spacing $d_{f4}$ equal to between 20 Hz and 1 kHz.

According to another embodiment of the present invention, the first, second, third and fourth frequency spacings are chosen such that:

$$f_{mod} > f_h - f_s/4 + d_{f1} + d_{f3}$$

$$f_{mod} < f_s/4 - d_{f1} - d_{f2} - d_{f4}/2,$$

wherein $f_{mod}$ is the modulation frequency, $f_h$ is the high frequency limit of the input digital signal, $f_s$ is the sampling frequency of the input digital signal, $d_{f1}$ to $d_{f4}$ are the first, second, third and fourth frequency spacings respectively.

According to another embodiment of the present invention, the signal processor further comprises a delay element coupled between the first output of the processing circuitry and the insertion circuitry.

According to another embodiment of the present invention, the processing circuitry is arranged to remove acoustic echoes from said digital input signal.

According to a further aspect of the present invention, there is provided a communications device comprising a speaker, a microphone, and the above signal processor.

According to a further aspect of the present invention, there is provided a method of processing a digital input signal comprising samples sampled at a sampling frequency, the method comprising dividing by a plurality of filters the digital input signal into a first signal in a first frequency band below a first cut-off frequency, and a second signal in a second frequency band above a second cut-off frequency; shifting by first frequency shifting circuitry the second signal to a frequency band below the first cut-off frequency; performing decimation by decimation circuitry on the first signal to generate a first decimated signal and on the second frequency shifted signal to generate a second decimated signal, the first and second decimated signals having samples at most at half the sampling frequency of the digital input signal; and processing by processing circuitry the decimated first and second signals.

BRIEF DESCRIPTION

The foregoing and other purposes, features, aspects and advantages of the invention will become apparent from the following detailed description of embodiments, given by way of illustration and not limitation with reference to the accompanying drawings, in which.

DETAILED DESCRIPTION

Figure 1:
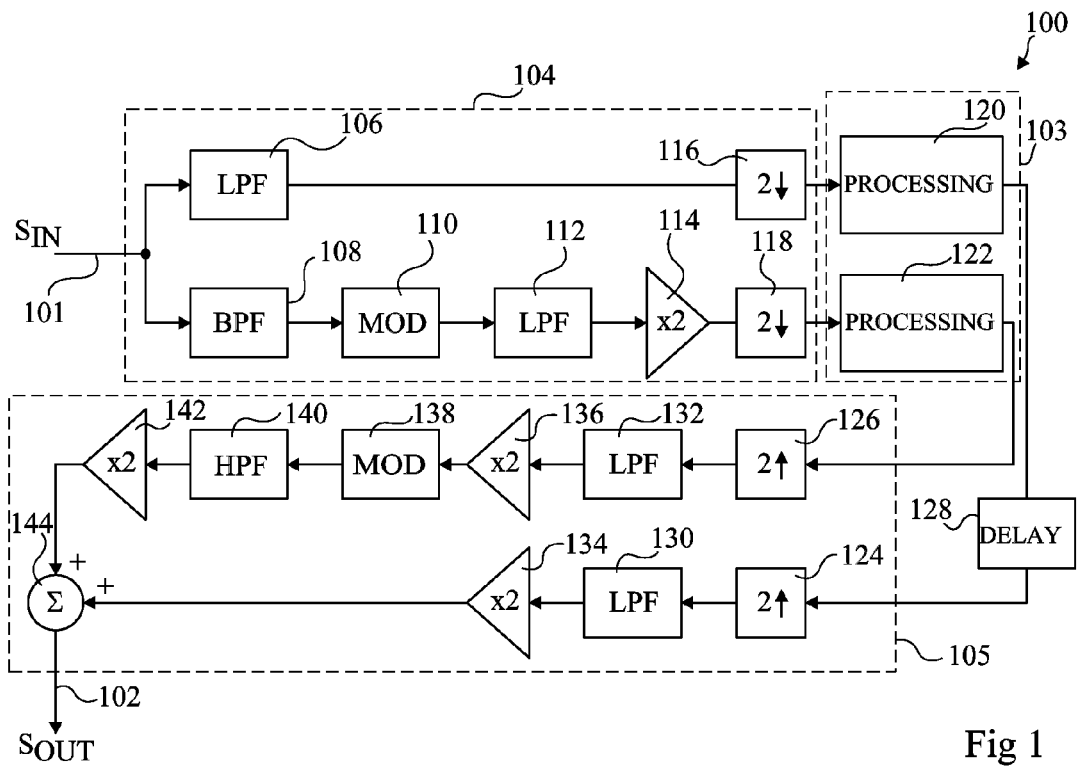
FIG. 1 illustrates signal processing circuitry according to one embodiment of the present invention.

FIG. 1 illustrates a digital signal processor 100, comprising an input line 101 for receiving a digital input signal $S_{IN}$, and an output line 102 for providing a digital output signal $S_{OUT}$. The signal processor 100 further comprises processing circuitry 103 for processing the input signal $S_{IN}$ to generate the output signal $S_{OUT}$. The input signal $S_{IN}$ is first processed by pre-processing circuitry 104 before being provided to processing circuitry 103, and signals generated by processing circuitry 103 are processed by post-processing circuitry 105 before being output as the signal $S_{OUT}$.

The input signal SIN for example relates to an audio signal and comprises digital samples corresponding to a sampling rate fs, which is for example in the range 8 kHz to around 200 kHz, and for example at 16 kHz. For example, the input signal results from digitally sampling an analog signal at over twice the Nyquist frequency, the digital samples for example being provided directly to the input line 101, or transmitted by a wired or wireless transmission path. The input signal is for example a wide-band signal.

As will be explained in more detail below, pre-processing circuitry 104 splits the input signal into separate frequency band components, which can each then be processed separately, before being recombined to reconstruct a signal having the same bandwidth as the input signal.

The input line 101 is coupled to the pre-processing circuitry 104, and in particular to a low-pass filter 106 and to a band-pass filter 108. The output of filter 108 is coupled to the input of modulation circuitry 110, the output of which is coupled to a further low-pass filter 112. The output of filter 112 is coupled in turn to an amplifier 114, and the outputs of both low-pass filter 106 and amplifier 114 are coupled to respective decimation blocks 116 and 118. The outputs of decimation blocks 116 and 118 are coupled to respective processing blocks 120 and 122 of the processing circuitry 103, which performs a function on these signals.

The outputs of blocks 120 and 122 are coupled to the post-processing circuitry 105 and in particular to over-sampling blocks 124 and 126 respectively. In this example a delay block 128 is coupled between the output of processing block 120 and the input of over-sampling block 124. The outputs of over-sampling blocks 124 and 126 are coupled to respective low-pass filters 130 and 132, the outputs of which are in turn coupled to inputs of amplifier blocks 134 and 136 respectively. The output of amplifier 136 is coupled to a modulation block 138, which is further coupled to a high-pass filter 140. The output of high pass filter 140 is coupled to an amplifier 142. The outputs of amplifiers 134 and 142 are coupled to respective inputs of an adder 144, which combines these signals to provide the output signal $S_{OUT}$ on the output line 102.

Operation of the circuitry FIG. 1 will now be described with reference to the diagrams shown in FIGS. 2, 3A and 3B.

Figure 2:
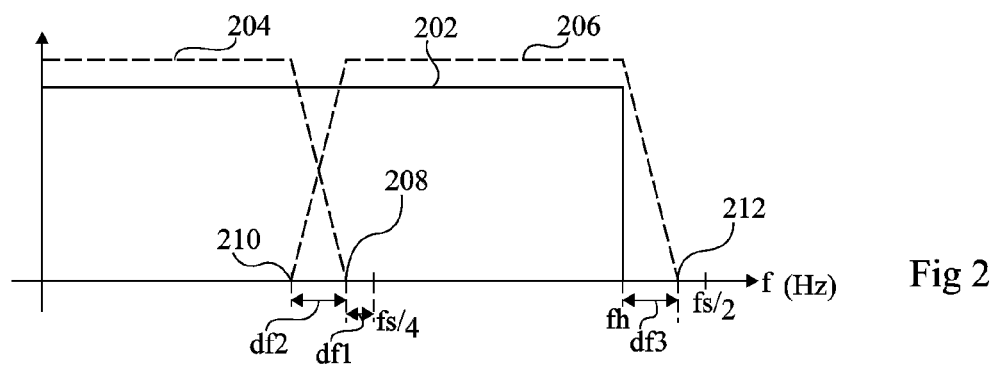
FIG. 2 is a diagram illustrating cut-off frequencies of filters of the circuit of FIG. 1 according to an embodiment of the present invention.

In the diagram of FIG. 2, a rectangle 202 represents the frequency bandwidth of the input signal $S_{IN}$ received on line 101 of the signal processor 100 of FIG. 1. As illustrated, the bandwidth of the input signal is between 0 Hz and a frequency $f_h$, where $f_h$ in this example is slightly lower than half the sampling frequency $f_s$. For example, assuming the sampling frequency is 16 kHz, $f_h$ is for example approximately 7 kHz.

Dashed line 204 in FIG. 2 represents the characteristics of the low-pass filter 106 of FIG. 1, while the dashed line 206 in FIG. 2 represents the characteristics of the band-pass filter 108 of FIG. 1.

The low-pass filter 106 has a cut-off frequency 208, which is chosen to be slightly less than $f_s/4$, and in particular, a frequency spacing $d_{f1}$ below $f_s/4$. The band-pass filter 108 has a low cut-off frequency 210, lower than cut-off frequency 208, and in particular a frequency spacing $d_{f2}$ below cut-off frequency 208. The band-pass filter 108 has a high cut-off frequency 212 between $f_h$ and $f_s/2$, and in particular a frequency $d_{f3}$ higher than $f_h$.

The cut-off frequencies of the low-pass filter 106 and band-pass filter 108 of FIG. 1 are thus chosen such that the input signal $S_{IN}$ is more or less divided into two equal sized frequency bands.

The output of the filter 108 has a frequency range between the low and high cut-off frequencies 210 and 212 of the band-pass filter 108. In order to shift this frequency band to a low frequency band, the signal is modulated by the modulation block 110 of FIG. 1, resulting for example in a multiplication of the signal by:

$$\cos\left(2n\pi \frac{f_{mod}}{f_s}\right)$$

where n is the sample number, $f_{mod}$ is the modulation frequency, and $f_s$ is the sampling frequency.

Figure 3A:
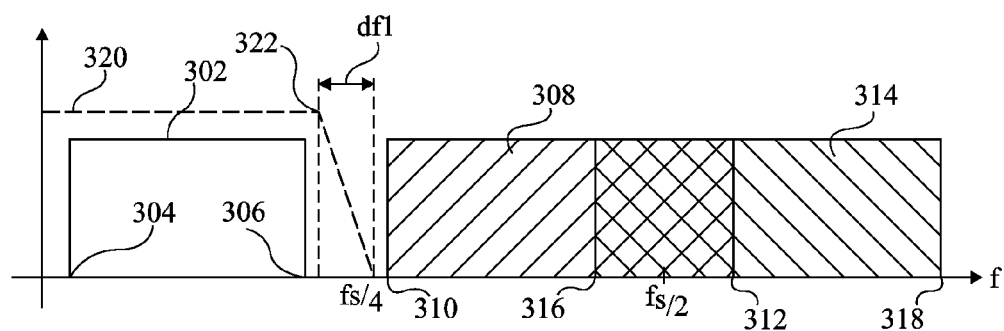
FIGS. 3A and 3B are diagrams illustrating cut-off frequencies of further filters of the circuit of FIG. 1 according to an embodiment of the present invention.

FIG. 3A illustrates part of the resulting modulated signal from the modulation block 110. Part of the resulting signal 302 is in a frequency range between a low frequency 304 and a high frequency 306, the low and high frequencies being determined by the modulation frequency fmod. In particular, frequency 304 is equal to f210−fmod, while frequency 306 is equal to f212−fmod, where f210 and f212 are the cut-off frequencies 210 and 212 respectively. A neighboring part 308 of the modulated signal is comprised between a frequency 310 equal to −f212+fs−fmod and a frequency 312 equal to −f210+fs−fmod. Furthermore, the next adjacent part 314 of the modulated signal is between a frequency 316 equal to f210+fmod and a frequency 318 equal to f212+fmod.

The characteristics of the low-pass filter 112 of FIG. 1 are shown in FIG. 3A by dashed line 320. This filter is designed to have a cut-off frequency in this example of $f_s/4$, thereby retaining only part 302 of the modulated signal. The knee 322 of the low-pass filter is for example positioned approximately at a spacing $d_{f1}$ below the cut-off frequency.

The output of the low-pass filter 112 of FIG. 1 is provided to the amplifier 114, which multiplies the filtered signal to compensate for the attenuation resulting from the modulation step, which for example reduces the amplitude to half its original value.

In this example, decimation blocks 116 and 118 perform times-two decimation, meaning that every other value output by low-pass filters 106 and 112 respectively are eliminated, thereby reducing the number of samples by a factor of 2.

The signal processing blocks 120, 122, for example, perform functions on the decimated signals that modify these signals by the same or different functions. This modification may, for example, be based on other signals provided to blocks 120, 122.

The band-pass filter 108, modulation block 110, low-pass filter 112, and amplifier 114 may introduce more delay to the signal than the low-pass filter 106. To re-synchronize the signals with each other, the delay block 128 may be provided at the output of the signal processing block 120. In alternative embodiments, this delay block 128 could be provided elsewhere, for example at the input to processing block 120.

The over-sampling blocks 124 and 126 increase the sampling rates of the signals output by blocks 120 and 122 to their original rate prior to the decimation performed by blocks 116 and 118. In this example, the sampling rates are doubled by inserting zeros between each sample. Low-pass filtering is then performed on both signals, to filter out any frequency components higher than the original frequency band, in other words the frequency band before over-sampling, for example on input line 101. For example, low-pass filters 130 and 132 have the same characteristics as filter 112. Amplifiers 134 and 136 and low-pass filtering blocks 130 and 132 compensate for attenuation resulting from the zero insertion by blocks 124 and 126.

Modulation block 138 for example performs modulation based on the same modulation frequency $f_{mod}$ as modulation block 110.

Figure 3B:
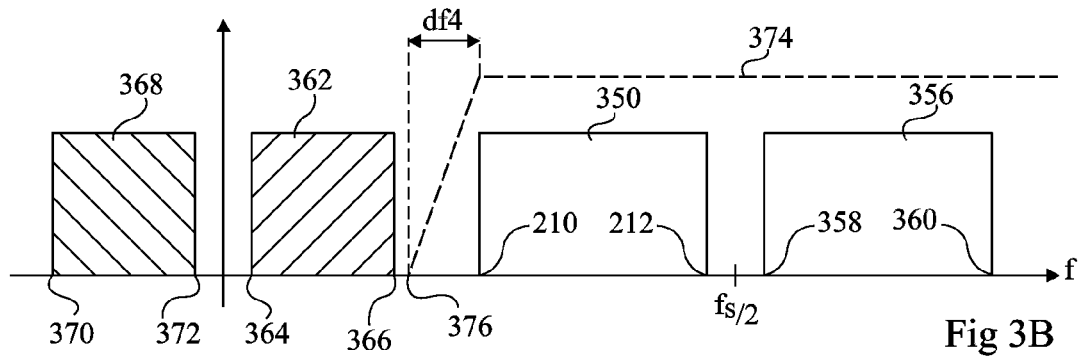

FIG. 3B illustrates part of the signals resulting from the modulation by block 138. A part 350 of the resulting signal is between frequency $f_{210}$, which is the low cut-off frequency of the band-pass filter 108, and frequency $f_{212}$, which is the high cut-off frequency of band-pass filter 108. Furthermore, a neighboring part 356 of the signal is between a frequency 358 equal to $-f_{212}+f_{mod}+f_s-f_{mod}$, i.e. $-f_{212}+f_s$, and a frequency 360 equal to $f_{210}+f_{mod}+f_s-f_{mod}$. Furthermore, a neighboring part 362 of the modulated signal is between a frequency 364, equal to $-f_{212}+2f_{mod}$ and a frequency 366 equal to $-f_{210}+2f_{mod}$, and a neighboring part 368 of the modulated signal is between a frequency 370 equal to $f_{210}-2f_{mod}$ and a frequency 372 equal to $f_{212}-2f_{mod}$.

The high pass filter 140 for example has filter characteristics shown by dashed line 374, having a cut-off frequency 376 for example corresponding to $f_{210}-d_{f4}$, and a knee frequency equal for example to the low cut-off frequency $f_{210}$ of band-pass filter 108, where $d_{f4}$ is a frequency spacing chosen as will be explained in more detail below.

In alternative embodiments, the high-pass filter 140 could be replaced by a band-pass filter, having a high cut-off frequency for example chosen to filter out part 356 of the modulated signal, for example at approximately $f_s/2$.

Thus the following inequalities can be determined:

$$f_{mod} > f_h - f_s/4 + d_{f1} + d_{f3}$$

$$f_{mod} < f_s/4 - d_{f1} - d_{f2} - d_{f4}/2$$

The values of the frequency spacings $d_{f1}$, $d_{f2}$, $d_{f3}$ and $d_{f4}$ shown in FIGS. 2, 3A and 3B and the modulation frequency $f_{mod}$ may therefore be chosen based on the sampling frequency $f_s$ and the frequency $f_h$. According to one example, the values of $d_{f1}$, $d_{f3}$ and $d_{f4}$ are chosen to be equal, and the value of $d_{f2}$ is chosen to equal twice the value of $d_{f1}$. For example, the inequalities may be transformed into the following equations:

$$f_{mod} = f_h - f_s/4 + d_{f1} + d_{f3}$$

$$f_{mod} = f_s/4 - d_{f1} - d_{f2} - d_{f4}/2$$

$$d_{f2} = 2d_{f1}$$

$$d_{f3} = d_{f1}$$

$$d_{f4} = d_{f1}$$

Assuming that the sampling frequency fs is 16 kHz and that fh is 7 kHz, a modulation frequency fmod of approximately 3.36 kHz, a value of df1, df3 and df4 of approximately 182 Hz, and a value of df2 equal to approximately 364 Hz are for example used.

Figure 4:
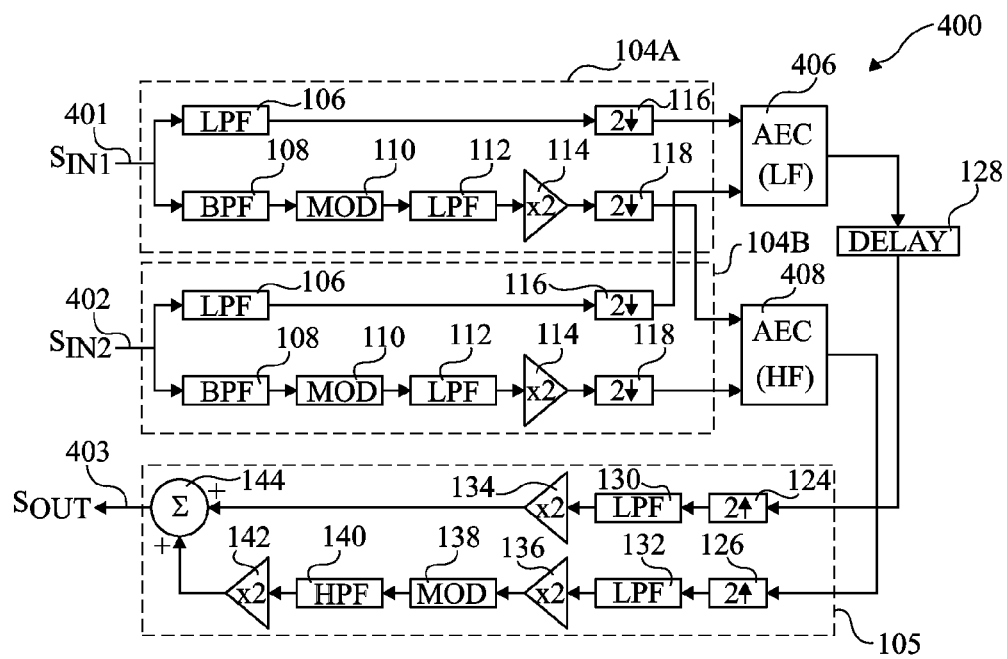
FIG. 4 illustrates signal processing circuitry according to a further embodiment of the present invention.

FIG. 4 illustrates signal processing circuitry 400 according to an alternative embodiment to FIG. 1. Elements in FIG. 4 that are the same as those in FIG. 1 have been labeled with like reference numerals and will not be described again in detail.

Two digital input signals $S_{IN1}$ and $S_{IN2}$ are provided on respective input lines 401 and 402, and an output signal $S_{OUT}$ is provided on an output line 403. Input line 401 is provided to a first pre-processing block 104A, while input line 402 is provided to a second pre-processing block 104B, blocks 104A and 104B each comprising the same elements as pre-processing circuitry 104. The outputs of the decimation blocks 116 of blocks 104A and 104B are coupled to respective inputs of a processing block 406, which in this example is an acoustic echo control (AEC) block 406, arranged to remove echoes from signal $S_{IN2}$. The outputs of decimation blocks 118 are provided to an AEC block 408, also arranged to remove echoes from signal $S_{IN2}$. The outputs of AEC blocks 406 and 408 are coupled to post-processing circuitry 105, comprising the same elements as this block in FIG. 1, and providing the output on line 403.

The signal processing circuitry 400 of FIG. 4 is for example arranged to process voice communications to be transmitted from a communications device such as a mobile telephone, comprising a microphone and speaker. In particular, the processing circuitry is arranged to remove echoes generated when the microphone picks up noise from the speaker of the mobile device. Signal $S_{IN1}$ for example comprises digital samples received on a transmission path from a remote communication terminal (not shown in FIG. 4) such as a remote mobile telephone, which has been output by a speaker of the communications device, and the second signal $S_{IN2}$ comprises samples of a signal received from the microphone of the communications device. Any suitable methods can be used to remove elements of the signal $S_{IN1}$ from the signal $S_{IN2}$ to be transmitted, and such methods will not be described in detail herein.

The outputs of AEC blocks 406, 408 are coupled to the over sampling blocks 124, 126 of the post-processing circuitry. As with the embodiment of FIG. 1, a delay block 128 is for example provided coupled between the AEC block 406 and the over sampling block 124.

Operation of the circuitry of FIG. 4 is similar to that of FIG. 1 and will not be described in detail. In particular, the pre-processing blocks 104A and 104B each divide the input signals $S_{IN1}$ and $S_{IN2}$ respectively into more or less equal-sized frequency bands, the low bands being processed by AEC 406, and the high bands, which have been frequency shifted to low bands, being processed by AEC 408. The outputs of blocks 406 and 408 are recombined by the post-processing circuitry 105 to generate an output signal having substantially the same frequency band as each of the original signals $S_{IN1}$ and $S_{IN2}$.

Figure 5:
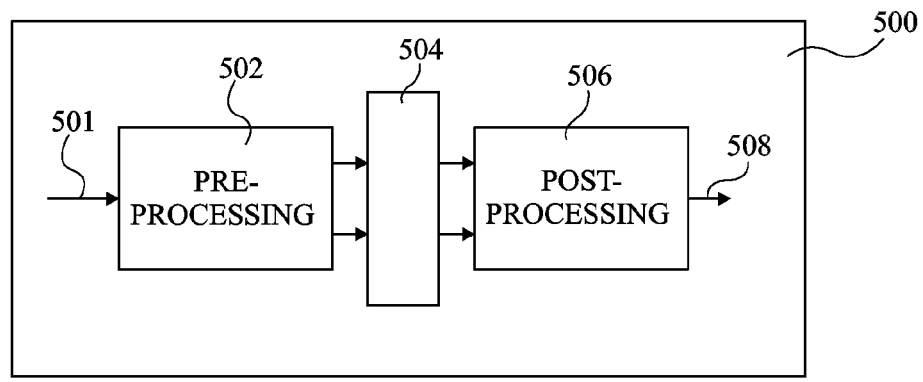
FIG. 5 illustrates an electronic device according to an embodiment of the present invention.

FIG. 5 illustrates an electronic device 500 comprising one or more inputs 501 for receiving a signal sampled at a sampling frequency $f_s$ and having a bandwidth for example of $f_s/2-k$, where k is for example between 100 and 5000 Hz. Line 501 is coupled to a pre-processing block 502, for example comprising circuitry 104, 104A and/or 104B described above, arranged to divide the signal into two frequency bands. The output of block 502 is coupled to signal processing block 504, for example comprising the processing blocks 120, 122, 406 and/or 408 described above. The output of block 504 is coupled to post-processing block 506, which for example comprises post-processing block 105 described above, for recombining the outputs of the processing block 103 to generate a signal having the frequency bandwidth of the original signal received on input line 501.

Alternatively, the pre-processing block 504 may be adapted to divide the input signal on line 501 into more than two frequency bands, for example into N frequency bands. For this, the pre-processing block for example comprises a band-pass filter for extracting each frequency band, except for the low frequency band, which can be extracted using a low-pass filter. Furthermore, a corresponding modulation block, low-pass filter, and decimation block are for example provided for shifting each frequency band to a low frequency band, and reducing the number of samples, for example, by suppressing all but one in every N samples. After processing, the N signals may be recombined again by over-sampling and modulating in a similar fashion. It should be noted that when over-sampling is performed by zero insertion at a higher rate, the gain of amplifiers 134 and 136 is increased accordingly.

Device 500 is for example a mobile telephone, personal or laptop computer, games console, portable media player or other device comprising digital signal processing circuitry.

An advantage of the embodiments described herein is that by dividing an input signal into at least two frequency bands, and processing these frequency bands separately, the complexity of the signal processing circuitry needed to process the signals can be much reduced. In particular, this allows the sampling frequency of the signals to be reduced, thereby reducing the number of samples in each signal, and simplifying signal processing.

Furthermore, in the embodiments of the pre-processing circuitry 104, 104A, 104B described herein, the frequency shifting circuitry 110 shifts the higher band portion of the signal to a lower frequency prior to the decimation step. This is advantageous as it prevents the risk of portions of the signal becoming irreversibly merged together. For example, assuming a signal periodic in the frequency domain with a sampling frequency of 16 kHz and having a high component with energy between 3500 Hz and 7000 Hz. Such a signal also therefore has energy in the bands [3500+16000*k, 7000+16000*k] and [−7000+16000*k, −3500+16000*k], where k is all positive and negative integers. If decimation is performed on such a signal directly, for example to reduce the signal to a sampling frequency of 8 kHz, the resulting signal will have energy in first bands [3500+8000*k, 7000+8000*k] and second bands [−7000+8000*k, −3500+8000*k]. Due at least in part to the fact that the frequency at half the new sampling frequency (4 kHz) is also found in the energy band of the original signal (3500 to 7000 Hz), for the case that, in the first bands, k=0, this leads to a band 3500 Hz to 7000 Hz, while for the case that, in the second bands, k=1, this leads to a band 1000 Hz to 4500 Hz. Thus there is an overlap of these bands between 3500 Hz and 4500 Hz, where the signals will be irreversibly merged.

On the contrary, if the high component of the signal is shifted prior to decimation, the problem does not arise. In particular, modulation at a frequency "mod" leads to the following bands [3500+16000*k−mod, 7000+16000*k−mod], [3500+16000*k+mod, 7000+16000*k+mod], [−7000+16000*k−mod, −3500+16000*k−mod] and [−7000+16000*k+mod, −3500+16000*k+mod]. Assuming a modulation frequency of 3500 Hz, the modulated high component will have energy in the bands [16000k, 3500+16000*k], [7000+16000*k, 10500+16000*k], [−10500+16000*k, −7000+16000*k] and [−3500+16000*k, 16000*k]. In this case there are no overlapping bands in the range 0 to 4000 Hz, and thus a low pass filter can be applied with a cut-off frequency of 4 kHz, followed by decimation, without the risk of creating overlapping signals.

A further advantage of the embodiments described herein is a that the circuitry described introduces relatively little or no degradation to signal quality.

While a number of specific embodiments have been described, it will be apparent to those skilled in the art that there are numerous modifications and alternatives that may be applied. For example, it will be apparent to those skilled in the art that the techniques described herein can be used to divide an input signal into any number of frequency bands, depending to what extent the circuitry for processing the signal is to be simplified. Furthermore, the features described herein in relation to the various embodiments may be combined in any combination.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A signal processor for processing a digital input signal comprising samples sampled at a sampling frequency, the signal processor comprising:
    a plurality of filters arranged to divide the digital input signal into a first signal in a first frequency band below a first cut-off frequency, and a second signal in a second frequency band above a second cut-off frequency;
    first frequency shifting circuitry arranged to shift the second signal to a frequency band below the first cut-off frequency;
    decimation circuitry arranged to decimate the first signal to generate a first decimated signal and the second frequency shifted signal to generate a second decimated signal, the first and second decimated signals having samples at most at half the sampling frequency of the digital input signal, wherein the decimation circuitry is arranged to receive the second frequency shifted signal from the first frequency shifting circuitry; and
    processing circuitry arranged to process the decimated first and second signals.

2. The signal processor of claim 1, wherein the first frequency shifting circuitry comprises:
    first modulating circuitry arranged to modulate the second signal by a modulating signal at a modulation frequency; and
    a low-pass filter arranged to filter the modulated signal.

3. The signal processor of claim 2, wherein the first cut-off frequency is equal to $f_s/4-d_{f1}$, wherein $f_s$ is the sampling frequency, and $d_{f1}$ is a first frequency spacing, and the second cut-off frequency is equal to $f_s/4-d_{f2}$, where $d_{f2}$ is a second frequency spacing.

4. The signal processor of claim 3, wherein $d_{f1}$ and $d_{f2}$ are each equal to between 20 Hz and 1 kHz.

5. The signal processor of claim 3, wherein digital input signal has a frequency band between 0 Hz and a high frequency limit fh, the second signal has a frequency band between the second cut-off frequency and a third cut-off frequency equal to $f_h/2+d_{f3}$, wherein $d_{f3}$ is a third frequency spacing equal to between 20 Hz and 1 kHz.

6. The signal processor of claim 5, further comprising:
   insertion circuitry coupled to first and second outputs of the processing circuitry for receiving the first and second processed signals respectively, and arranged to insert samples into the processed first and second signals to generate modified first and second signals;
   second frequency shifting circuitry arranged to shift the second modified signal to a frequency band above the second cut-off frequency; and
   signal reconstruction circuitry arranged to combine said first modified signal and the frequency shifted second modified signal to generate an output signal having samples at said sampling frequency.

7. The signal processor of claim 6, wherein the second frequency shifting circuitry comprises:
   second modulation circuitry arranged to modulate the second signal by said modulating signal at the modulation frequency; and
   a high-pass filter arranged to filter the output of the second modulation circuitry.

8. The signal processor of claim 6, wherein the first and second frequency shifting circuitry each further comprise an amplifier for amplifying the modulated signals.

9. The signal processor of claim 7, wherein the high-pass filter has a cut-off frequency equal to the second cut-off frequency minus a fourth frequency spacing $d_{f4}$ equal to between 20 Hz and 1 kHz.

10. The signal processor of claim 9, wherein the first, second, third and fourth frequency spacings are chosen such that:

$$f_{mod} > f_h - f_s/4 + d_{f1} + d_{f3}$$

$$f_{mod} < f_s/4 - d_{f1} - d_{f2} - d_{f4}/2,$$

wherein $f_{mod}$ is the modulation frequency, $f_h$ is the high frequency limit of the input digital signal, $f_s$ is the sampling frequency of the input digital signal, and $d_{f1}$ to $d_{f4}$ are the first, second, third and fourth frequency spacings respectively.

11. The signal processor of claim 10, further comprising a delay element coupled between the first output of the processing circuitry and the insertion circuitry.

12. The signal processor of claim 11, wherein the processing circuitry is arranged to remove acoustic echoes from said digital input signal.

13. A communications device comprising a speaker, a microphone, and the signal processor of claim 12.

14. A method of processing a digital input signal comprising samples sampled at a sampling frequency, the method comprising:
   dividing, by a plurality of filters, the digital input signal into a first signal in a first frequency band below a first cut-off frequency, and a second signal in a second frequency band above a second cut-off frequency;
   shifting by first frequency shifting circuitry the second signal to a frequency band below the first cut-off frequency;
   performing decimation by decimation circuitry on the first signal to generate a first decimated signal and on the second frequency shifted signal to generate a second decimated signal, the first and second decimated signals having samples at most at half the sampling frequency of the digital input signal, wherein decimation of the second frequency shifted signal follows shifting of the second signal to a frequency band below the first cut-off frequency; and
   processing, by processing circuitry, the decimated first and second signals.

15. The method of claim 14, further comprising:
   inserting samples into the processed first and second signals to generate modified first and second signals;
   shifting the second modified signal to a frequency band above the second cut-off frequency; and
   combining the first modified signal and the frequency shifted second modified signal to generate an output signal having samples at the sampling frequency.

16. A signal processor comprising:
   a first filter configured to select from a digital input signal a first signal in a first frequency band below a first cut-off frequency;
   a second filter configured to select from the digital input signal a second signal in a second frequency band above a second cut-off frequency;
   a first frequency shifting circuit configured to shift the second signal to a frequency band below the first cut-off frequency;
   a first decimation circuit configured to decimate the first signal to generate a first decimated signal;
   a second decimation circuit configured to receive the frequency shifted second signal from the first frequency shifting circuit and to decimate the frequency shifted second signal to generate a second decimated signal, the first and second decimated signals having samples at most at half a sampling frequency of the digital input signal; and
   a processing circuit configured to process the first and second decimated signals.

17. A signal processor as defined in claim 16, wherein the first frequency shifting circuit comprises:
   a first modulating circuit configured to modulate the second signal by a modulating signal at a modulation frequency; and
   a low pass filter configured to filter the modulated signal.

18. A signal processor as defined in claim 17, wherein the first cut-off frequency is equal to $f_s/4-d_{f1}$, where $f_s$ is the sampling frequency and $d_{f1}$ is a first frequency spacing, and the second cut-off frequency is equal to $f_s/4-d_{f2}$, where $d_{f2}$ is a second frequency spacing.

19. A signal processor as defined in claim 18, wherein the digital input signal has a frequency band between 0 Hz and a high frequency limit fh, the second signal has a frequency band between the second cut-off frequency and a third cut-off frequency equal to $f_h/2+d_{f3}$, wherein $d_{f3}$ is a third frequency spacing equal to between 20 Hz and 1 kHz.

20. A signal processor as defined in claim 17, further comprising:
   first and second insertion circuits coupled to first and second outputs of the processing circuit, respectively, and configured to receive first and second processed signals from the processing circuit and to insert samples into the first and second processed signals to generate first and second modified signals, respectively;
   a second frequency shifting circuit configured to shift the second modified signal to a frequency band above the second cut-off frequency; and a signal reconstruction circuit configured to combine the first modified signal and the frequency shifted second modified signal to generate an output signal having samples at the sampling frequency.

21. A signal processor as defined in claim 20, wherein the second frequency shifting circuit comprises:
a second modulation circuit configured to modulate the second modified signal by the modulating signal at the modulation frequency; and
a high pass filter configured to filter an output of the second modulation circuit.

22. A signal processor as defined in claim 20, wherein the first and second frequency shifting circuits each further comprise an amplifier configured to amplify the respective frequency shifted signals.

23. A method for signal processing comprising:
selecting from a digital input signal a first signal in a first frequency band below a first cut-off frequency;
selecting from the digital input signal a second signal in a second frequency band above a second cut-off frequency;
frequency shifting the second signal to a frequency band below the first cut-off frequency;
decimating the first signal to generate a first decimated signal;
decimating the frequency shifted second signal to generate a second decimated signal, the first and second decimated signals having samples at most at half a sampling frequency of the digital input signal; and
processing the first and second decimated signals.

24. A method as defined in claim 23, wherein frequency shifting the second signal comprises:
modulating the second signal by a modulating signal at a modulation frequency; and
low pass filtering the modulated signal.

25. A method as defined in claim 24, further comprising:
receiving first and second processed signals and inserting samples into the first and second processed signals to generate first and second modified signals, respectively;
shifting the second modified signal to a frequency band above the second cut-off frequency; and
combining the first modified signal and the frequency shifted second modified signal to generate an output signal having samples at the sampling frequency.

26. A method as defined in claim 25, wherein shifting the second modified signal comprises:
modulating the second modified signal by the modulation signal at the modulation frequency; and
high pass filtering the modulated second modified signal.

27. A signal processor as defined in claim 25, further comprising amplifying the first frequency shifted second signal and the frequency shifted second modified signal.

* * * * *